(12) United States Patent
Asghari et al.

(10) Patent No.: US 11,579,305 B2
(45) Date of Patent: Feb. 14, 2023

(54) LIDAR OUTPUT STEERING SYSTEMS HAVING OPTICAL GRATINGS

(71) Applicant: SiLC Technologies, Inc., Monrovia, CA (US)

(72) Inventors: Mehdi Asghari, La Canada Flintridge, CA (US); Bradley Jonathan Luff, La Canada Flintridge, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 605 days.

(21) Appl. No.: 16/675,203

(22) Filed: Nov. 5, 2019

(65) Prior Publication Data

US 2021/0132232 A1 May 6, 2021

(51) Int. Cl.
*H04B 10/00* (2013.01)
*G01S 17/931* (2020.01)
*H04J 14/02* (2006.01)
*G01S 7/481* (2006.01)

(52) U.S. Cl.
CPC .......... *G01S 17/931* (2020.01); *G01S 7/4816* (2013.01); *H04J 14/0209* (2013.01)

(58) Field of Classification Search
CPC . H04B 10/112; H04B 10/1123; H04B 10/114; H04B 10/1143; H04B 10/1149; H04B 10/40; H04J 14/02; H04J 14/0209; G01S 7/4817; G01S 17/4816; G01S 7/42; G01S 17/4911; G01S 17/936; G01S 7/4816; G01S 17/42; G01S 17/89

USPC ....... 398/169, 170, 135, 136, 128, 127, 129, 398/130, 131, 79, 87, 158, 159, 118, 119; 356/4.01, 5.01, 3.01, 4.1

See application file for complete search history.

(56) References Cited

U.S. PATENT DOCUMENTS

| | | |
|---|---|---|
| 9,157,790 B2 | 10/2015 | Shpunt et al. |
| 9,753,351 B2 | 9/2017 | Eldada |
| 9,841,495 B2 | 12/2017 | Campbell et al. |
| 2018/0306925 A1* | 10/2018 | Hosseini ................. G01S 17/42 |
| 2019/0250396 A1* | 8/2019 | Blanche ............... G02B 26/101 |
| 2019/0310377 A1* | 10/2019 | Lodin ..................... G01S 7/4911 |
| 2019/0346568 A1 | 11/2019 | Asghari et al. |
| 2019/0369244 A1 | 12/2019 | Asghari et al. |
| 2019/0369251 A1 | 12/2019 | Feng et al. |
| 2019/0391242 A1 | 12/2019 | Asghari et al. |
| 2021/0063541 A1* | 3/2021 | Zheng ................... G01S 7/4817 |

OTHER PUBLICATIONS

Baghmisheh, B. B., "Chip-scale Lidar", 2017, University of California, Berkeley.

(Continued)

*Primary Examiner* — Hanh Phan
(74) *Attorney, Agent, or Firm* — Gavrilovich, Dodd & Lindsey LLP

(57) ABSTRACT

A LIDAR system includes a LIDAR assembly configured to output a LIDAR output signal that carries multiple different channels. A directional component has an optical grating that receives the LIDAR output signal from the LIDAR assembly. The directional component demultiplexes the LIDAR output signal into multiple LIDAR output channels that each carries a different one of the channels. The directional component is configured to steer a direction that the LIDAR output channels travel away from the LIDAR system.

7 Claims, 10 Drawing Sheets

(56) References Cited

OTHER PUBLICATIONS

Issakov, V. "Radar Systems, Ch 2. In Microwave Circuits for 24GHz Automotive Radar in Silicon-based Technologies", 2010, Berlin Heidelberg: Springer-Verlag.

Li, L., "Time-of-Flight Camera—An Introduction", 2014, TI Technical White Paper SLOA190B.

Velodyne, "HDL-64E S2 Datasheet. Retrieved from http://velodynelidar.com/lidar/products/brochure/HDL-64E%20S2%20datasheet_2010_lowres.pdf", 2017.

* cited by examiner

LIDAR OUTPUT STEERING SYSTEMS HAVING OPTICAL GRATINGS

FIELD

The invention relates to optical devices. In particular, the invention relates to LIDAR assemblies.

BACKGROUND

There is an increasing commercial demand for 3D sensing systems that can be economically deployed in applications such as ADAS (Advanced Driver Assistance Systems) and AR (Augmented Reality). LIDAR (Light Detection and Ranging) sensors are used to construct a 3D image of a target scene by illuminating the scene with laser light and measuring the returned signal.

One way that LIDAR assemblies generate LIDAR data (radial velocity and/or distance between a LIDAR system and an object external to the LIDAR system) for larger fields of view is to concurrently generate the LIDAR data from multiple different LIDAR signals the concurrently illuminate different regions in the field of view. The different LIDAR signals are scanned so as to cover the field of view. The available scanning mechanisms are often ineffective for multiple LIDAR signals, undesirably large, and/or expensive. As a result, there is a need for a LIDAR assembly that is suitable for use with larger fields of view.

SUMMARY

A LIDAR system includes a LIDAR assembly configured to output a LIDAR output signal that carries multiple different channels. A directional component has an optical grating that receives the LIDAR output signal from the LIDAR assembly. The directional component demultiplexes the LIDAR output signal into multiple LIDAR output channels. The directional component is configured to steer a direction that the LIDAR output channels travel away from the LIDAR system.

DESCRIPTION

A LIDAR assembly is configured to output a LIDAR output signal that includes multiple different channels. A directional component receives the LIDAR output signal from the LIDAR assembly. The directional component demultiplexes the LIDAR output signal into multiple different LIDAR output channels that each carries a different one of the channels. The directional component is configured to steer the direction that the LIDAR output channels travel away from the LIDAR assembly. The LIDAR output channels are steered such that different LIDAR output channels concurrently illuminate different sample regions in a field of view.

Light from the LIDAR output channels can return to the LIDAR assembly after being reflected by one or more objects located outside of the LIDAR system. LIDAR data can be generated for each of the channels that returns to the LIDAR assembly. The ability to develop the LIDAR data for multiple different channels allows LIDAR data to be developed for larger fields of view. Additionally or alternately, the ability to develop the LIDAR data from multiple channels increases the rate at which LIDAR data is developed for a field of view.

In some instances, the directional component includes an optical grating that demultiplexes the LIDAR output signal. The optical grating can be moved such that the direction of each LIDAR output channel changes in response to the movement of the optical grating. As a result, the movement of the optical grating can be used to steer the LIDAR output channels to the different sample regions within a field of view. Scanning the LIDAR output channels to each sample region in a field of view allows LIDAR data to be generated for the entire field of view. Using optical gratings to steer the LIDAR output channels can be compact, affordable, and simple.

Figure 1:
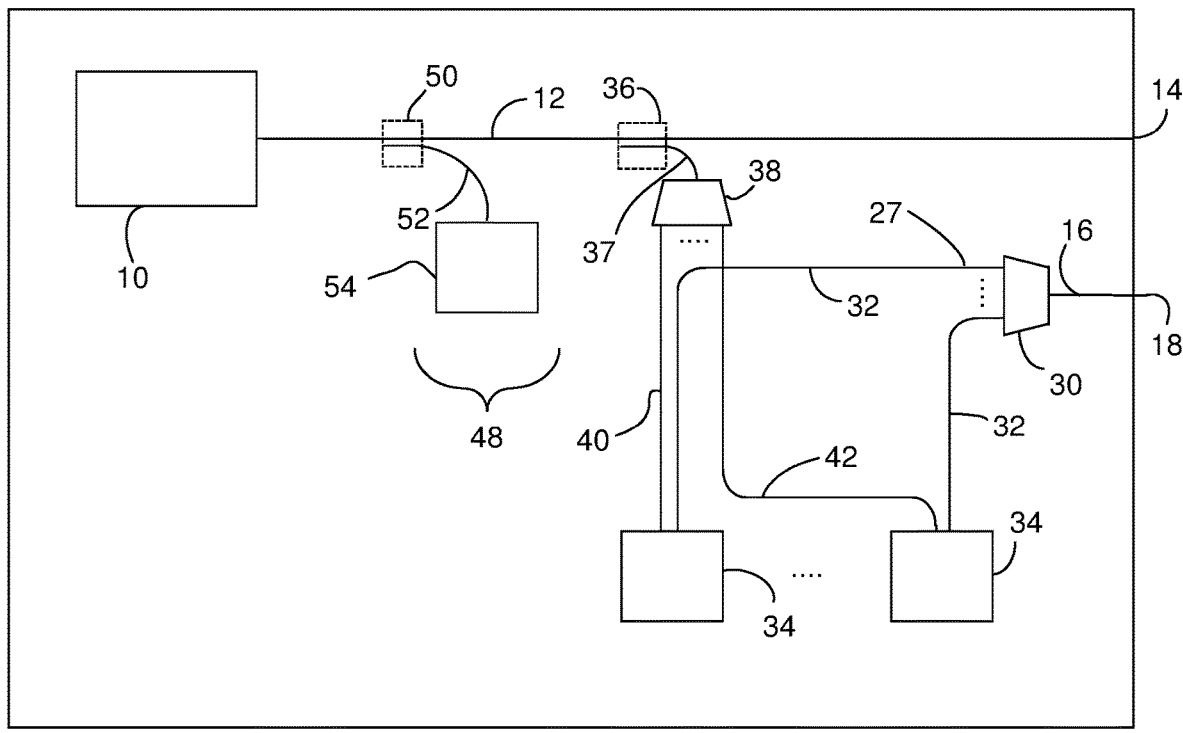
FIG. 1 is a top view of a LIDAR chip that is suitable for use with a LIDAR adapter.
Figure 1:
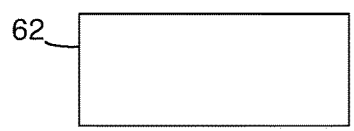

FIG. 1 is a topview of a LIDAR chip that includes a light source 10 that outputs an outgoing LIDAR signal. The outgoing LIDAR signal includes one or more different channels that are each at a different wavelength. The wavelengths of the channels can be periodically spaced in that the wavelength increase from one channel to the next channel (the channel spacing) is constant or substantially constant. In some instances, the channels spacing is constant and greater than 0.5 nm, 1 nm, 3 nm, or 5 nm, and/or less than 10 nm, 15 nm, or 20 nm. In some instances, the number of channels, N, is greater than 2, 4 or 8 and/or less than 16, 32, or 64. A suitable light source 10 for generating multiple channels with periodically spaced wavelengths includes, but is not limited to, comb lasers and one or more single wavelength and/or one or more multiple wavelength lasers with outputs multiplexed into an outgoing LIDAR signal.

The LIDAR chip also includes a utility waveguide 12 that receives the outgoing LIDAR signal from the light source 10. The utility waveguide 12 terminates at a facet 14 and carries the outgoing LIDAR signal to the facet 14. The facet 14 can be positioned such that the outgoing LIDAR signal traveling through the facet 14 exits the chip and serves as a LIDAR output signal. For instance, the facet 14 can be positioned at an edge of the chip so the outgoing LIDAR signal traveling through the facet 14 exits the chip and serves as a LIDAR output signal.

The LIDAR output signal travels away from the chip and may be reflected by objects in the path of the LIDAR output signal. The reflected signal travels away from the objects. When the LIDAR output signal is reflected, at least a portion of the light from the reflected signal is returned to an input waveguide 16 on the LIDAR chip as a LIDAR input signal. The input waveguide 16 includes a facet 18 through which the LIDAR input signal can enter the input waveguide 16. The portion of the LIDAR input signal that enters the input waveguide 16 can be considered an incoming LIDAR signal. The input waveguide 16 carries the incoming LIDAR signal to comparative demultiplexer 30. When the incoming LIDAR signal includes multiple channels, the comparative demultiplexer 30 divides the incoming LIDAR signal into different comparative signals that each has a different wavelength that corresponds to one of the channels. The comparative demultiplexer 30 outputs the comparative signals on different comparative waveguides 32. The comparative waveguides 32 each carry one of the comparative signals to a different processing component 34.

The LIDAR chip includes a splitter 36 that moves a portion of the outgoing LIDAR signal from the utility waveguide 12 onto a reference waveguide 37 as a reference signal. Suitable splitters 36 include, but are not limited to, optical couplers, y-junctions, and MMIs.

The reference waveguide 37 carries the reference light signal to a reference demultiplexer 38. When the reference light signal includes multiple channels, the reference demultiplexer 38 divides the reference light signal into different reference signals that each has a different wavelength. The reference demultiplexer 38 outputs the reference signals on different reference waveguides 40. The reference waveguides 40 each carry one of the reference signals to a different one of the processing components 34.

The comparative waveguides 32 and the reference waveguides 40 are configured such that a comparative signal and the corresponding reference signal are received at the same processing component 34. For instance, the comparative waveguides 32 and the reference waveguides 40 are configured such that the comparative signal and the corresponding reference signal of the same wavelength and/or carrying the same channel are received at the same processing component 34.

As will be described in more detail below, the processing components 34 each combines a comparative signal with the corresponding reference signal to form a composite signal that carries LIDAR data for a sample region on the field of view. Accordingly, the composite signal can be processed so as to extract LIDAR data (radial velocity and/or distance between a LIDAR system and an object external to the LIDAR system) for the sample region.

The LIDAR chip can include a control branch 48 for controlling operation of the light source 10. The control branch 48 includes a directional coupler 50 that moves a portion of the outgoing LIDAR signal from the utility waveguide 12 onto a control waveguide 52. The coupled portion of the outgoing LIDAR signal serves as a tapped signal. Although FIG. 1 illustrates a directional coupler 50 moving portion of the outgoing LIDAR signal onto the control waveguide 52, other signal-tapping components can be used to move a portion of the outgoing LIDAR signal from the utility waveguide 12 onto the control waveguide 52. Examples of suitable signal tapping components include, but are not limited to, y-junctions, and MMIs.

The control waveguide 52 carries the tapped signal to control components 54. The control components can be in electrical communication with electronics 62. During operation, the electronics 62 can adjust the frequency of the outgoing LIDAR signal in response to output from the control components. An example of a suitable construction of control components is provided in U.S. patent application Ser. No. 15/977,957, filed on 11 May 2018, entitled "Optical Sensor Chip," and incorporated herein in its entirety.

Suitable electronics 62 can include, but are not limited to, a controller that includes or consists of analog electrical circuits, digital electrical circuits, processors, microprocessors, digital signal processors (DSPs), computers, microcomputers, or combinations suitable for performing the operation, monitoring and control functions described above. In some instances, the controller has access to a memory that includes instructions to be executed by the controller during performance of the operation, control and monitoring functions. Although the electronics are illustrated as a single component in a single location, the electronics can include multiple different components that are independent of one another and/or placed in different locations. Additionally, as noted above, all or a portion of the disclosed electronics can be included on the chip including electronics that are integrated with the chip.

Although the light source 10 is shown as being positioned on the LIDAR chip, all or a portion of the light source 10 can be located off the LIDAR chip.

Figure 2:
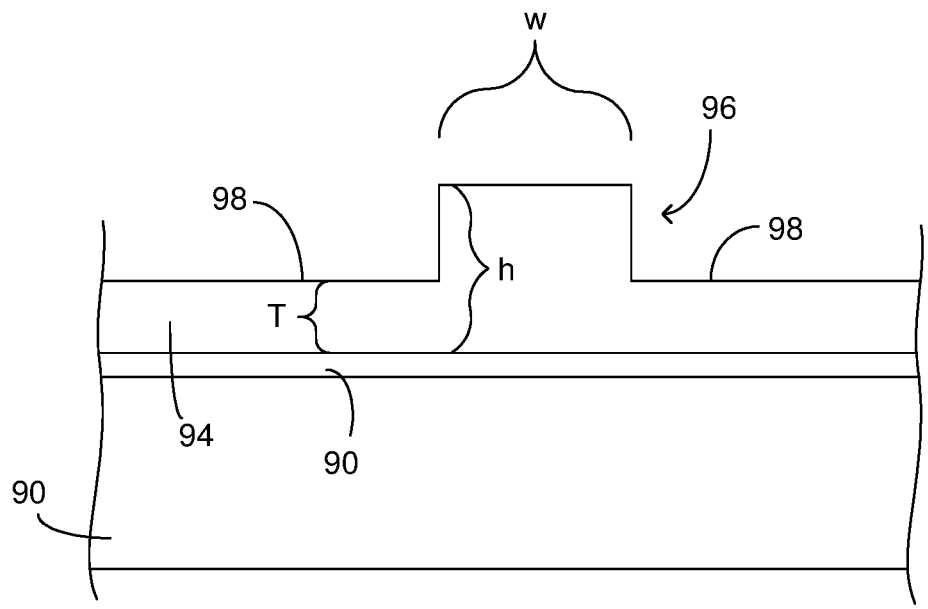
FIG. 2 is a cross-section of a LIDAR chip according to FIG. 1 constructed from a silicon-on-insulator wafer.

Suitable platforms for the LIDAR chips include, but are not limited to, silica, indium phosphide, and silicon-on-insulator wafers. FIG. 2 is a cross-section of portion of a chip constructed from a silicon-on-insulator wafer. A silicon-on-insulator (SOI) wafer includes a buried layer 90 between a substrate 92 and a light-transmitting medium 94. In a silicon-on-insulator wafer, the buried layer is silica while the substrate and the light-transmitting medium are silicon. The substrate of an optical platform such as an SOI wafer can serve as the base for the entire chip. For instance, the optical components shown in FIG. 1 can be positioned on or over the top and/or lateral sides of the substrate.

The portion of the chip illustrated in FIG. 2 includes a waveguide construction that is suitable for use with chips constructed from silicon-on-insulator wafers. A ridge 96 of the light-transmitting medium extends away from slab regions 98 of the light-transmitting medium. The light signals are constrained between the top of the ridge and the buried oxide layer.

The dimensions of the ridge waveguide are labeled in FIG. 2. For instance, the ridge has a width labeled w and a height labeled h. A thickness of the slab regions is labeled T. For LIDAR applications, these dimensions can be more important than other dimensions because of the need to use higher levels of optical power than are used in other applications. The ridge width (labeled w) is greater than 1 μm and less than 4 μm, the ridge height (labeled h) is greater than 1 μm and less than 4 μm, the slab region thickness is greater than 0.5 μm and less than 3 μm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 µm and less than 0.5 µm. While the above dimensions will generally provide the straight or substantially straight portions of a waveguide with a single-mode construction, they can result in the tapered section(s) and/or curved section(s) that are multi-mode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions. The waveguide construction of FIG. 2 is suitable for all or a portion of the waveguides on LIDAR chips constructed according to FIG. 1.

The LIDAR chips can be used in conjunction with a LIDAR adapter. In some instances, the LIDAR adapter can be optically positioned between the LIDAR chip and the one or more reflecting objects and/or the field of view in that an optical path that the LIDAR input signal(s) and/or the LIDAR output signal travels from the LIDAR chip to the field of view passes through the LIDAR adapter. Additionally, the LIDAR adapter can be configured to operate on the LIDAR input signal and the LIDAR output signal such that the LIDAR input signal and the LIDAR output signal travel on different optical pathways between the LIDAR adapter and the LIDAR chip but on the same optical pathway between the LIDAR adapter and a reflecting object in the field of view.

Figure 3:
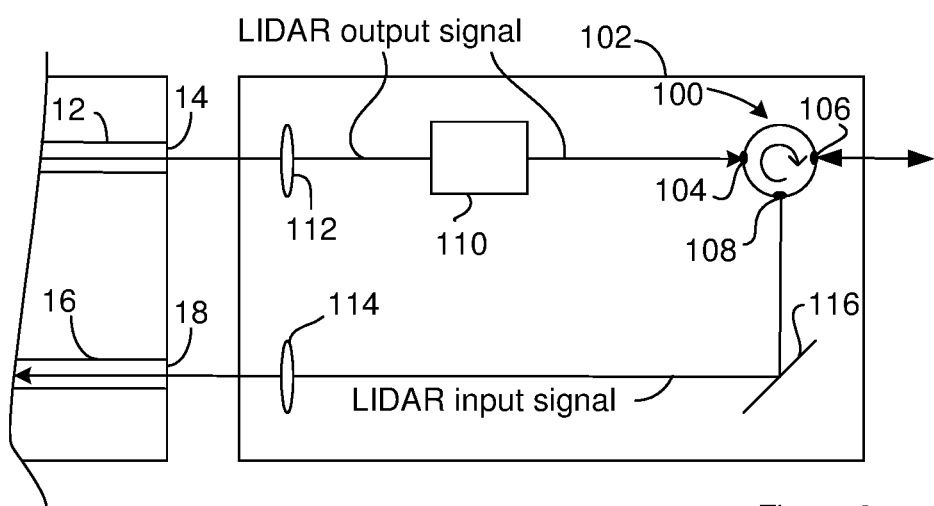
FIG. 3 is a top view of a LIDAR adapter in optical communication with an LIDAR chip.

An example of a LIDAR adapter that is suitable for use with the LIDAR chip of FIG. 1 is illustrated in FIG. 3. The LIDAR adapter includes multiple components positioned on a base. For instance, the LIDAR adapter includes a circulator 100 positioned on a base 102. The illustrated optical circulator 100 includes three ports and is configured such that light entering one port exits from the next port. For instance, the illustrated optical circulator includes a first port 104, a second port 106, and a third port 108. The LIDAR output signal enters the first port 104 from the utility waveguide 12 of the LIDAR chip and exits from the second port 106. The LIDAR adapter can be configured such that the output of the LIDAR output signal from the second port 106 can also serve as the output of the LIDAR output signal from the LIDAR adapter. As a result, the LIDAR output signal can be output from the LIDAR adapter such that the LIDAR output signal is traveling toward a sample region in the field of view.

The LIDAR output signal output from the LIDAR adapter includes, consists of, or consists essentially of light from the LIDAR output signal received from the LIDAR chip. Accordingly, the LIDAR output signal output from the LIDAR adapter may be the same or substantially the same as the LIDAR output signal received from the LIDAR chip. However, there may be differences between the LIDAR output signal output from the LIDAR adapter and the LIDAR output signal received from the LIDAR chip. For instance, the LIDAR output signal can experience optical loss as it travels through the LIDAR adapter.

When an object in the sample region reflects the LIDAR output signal, at least a portion of the reflected light travels back to the circulator 100 as a LIDAR return signal. The LIDAR return signal enters the circulator 100 through the second port 106. FIG. 3 illustrates the LIDAR output signal and the LIDAR return signal traveling between the LIDAR adapter and the sample region along the same optical path.

The LIDAR return signal exits the circulator 100 through the third port 108 and is directed to the input waveguide 16 on the LIDAR chip. Accordingly, light from the LIDAR return signal can serve as the LIDAR input signal and the LIDAR input signal includes or consists of light from the LIDAR return signal. Accordingly, the LIDAR output signal and the LIDAR input signal travel between the LIDAR adapter and the LIDAR chip along different optical paths.

As is evident from FIG. 3, the LIDAR adapter can include optical components in addition to the circulator 100. For instance, the LIDAR adapter can include components for directing and controlling the optical path of the LIDAR output signal and the LIDAR return signal. As an example, the adapter of FIG. 3 includes an optional amplifier 110 positioned so as to receive and amplify the LIDAR output signal before the LIDAR output signal enters the circulator 100. The amplifier 110 can be operated by the electronics 62 allowing the electronics 62 to control the power of the LIDAR output signal.

FIG. 3 also illustrates the LIDAR adapter including an optional first lens 112 and an optional second lens 114. The first lens 112 can be configured to couple the LIDAR output signal to a desired location. In some instances, the first lens 112 is configured to focus or collimate the LIDAR output signal at a desired location. In one example, the first lens 112 is configured to couple the LIDAR output signal on the first port 104 when the LIDAR adapter does not include an amplifier 110. As another example, when the LIDAR adapter includes an amplifier 110, the first lens 112 can be configured to couple the LIDAR output signal on the entry port to the amplifier 110. The second lens 114 can be configured to couple the LIDAR input signal at a desired location. In some instances, the second lens 114 is configured to focus or collimate the LIDAR input signal at a desired location. For instance, the second lens 114 can be configured to couple the LIDAR input signal on the facet 18 of the input waveguide 16.

The LIDAR adapter can also include one or more direction changing components such as mirrors. FIG. 3 illustrates the LIDAR adapter including a mirror as a direction-changing component 116 that redirects the LIDAR return signal from the circulator 100 to the facet 18 of the input waveguide 16.

The LIDAR chips include one or more waveguides that constrains the optical path of one or more light signals. While the LIDAR adapter can include waveguides, the optical path that the LIDAR return signal and the LIDAR output signal travel between components on the LIDAR adapter and/or between the LIDAR chip and a component on the LIDAR adapter can be free space. For instance, the LIDAR return signal and/or the LIDAR output signal can travel through the atmosphere in which the LIDAR chip, the LIDAR adapter, and/or the base 102 is positioned when traveling between the different components on the LIDAR adapter and/or between a component on the LIDAR adapter and the LIDAR chip. As a result, optical components such as lenses and direction changing components can be employed to control the characteristics of the optical path traveled by the LIDAR return signal and the LIDAR output signal on, to, and from the LIDAR adapter.

Suitable bases 102 for the LIDAR adapter include, but are not limited to, substrates, platforms, and plates. Suitable substrates include, but are not limited to, glass, silicon, and ceramics. The components can be discrete components that are attached to the substrate. Suitable techniques for attaching discrete components to the base 102 include, but are not limited to, epoxy, solder, and mechanical clamping. In one example, one or more of the components are integrated components and the remaining components are discrete components. In another example, the LIDAR adapter includes one or more integrated amplifiers and the remaining components are discrete components.

Figure 4:
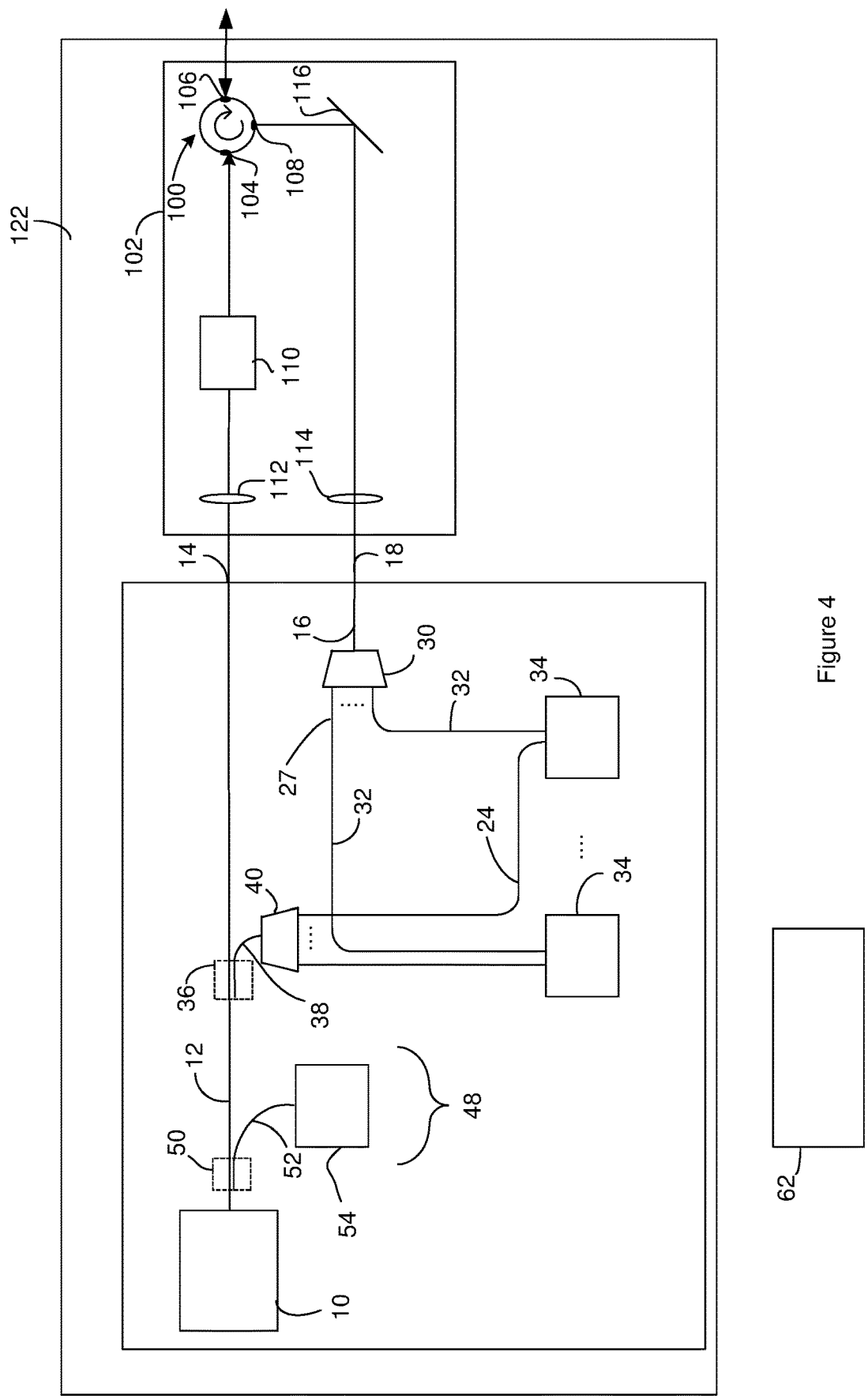
FIG. 4 is a topview of a LIDAR assembly that includes the LIDAR chip and electronics of FIG. 1 and the LIDAR adapter of FIG. 3 on a common support.

The LIDAR chip, electronics, and the LIDAR adapter can be positioned on a common mount. Suitable common mounts include, but are not limited to, glass plates, metal plates, silicon plates and ceramic plates. As an example, FIG. 4 is a topview of a LIDAR assembly that includes the LIDAR chip and electronics 62 of FIG. 1 and the LIDAR adapter of FIG. 3 on a common support 122. Although the electronics 62 are illustrated as being located on the common support, all or a portion of the electronics can be located off the common support. Suitable approaches for mounting the LIDAR chip, electronics, and/or the LIDAR adapter on the common support include, but are not limited to, epoxy, solder, and mechanical clamping.

Although the LIDAR assembly is shown as operating with a LIDAR chip that outputs a single LIDAR output signal, the LIDAR chip can be configured to output multiple LIDAR output signals. Multiple LIDAR adapters can be used with a single LIDAR chip and/or a LIDAR adapter can be scaled to receive multiple LIDAR output signals.

Figure 5:
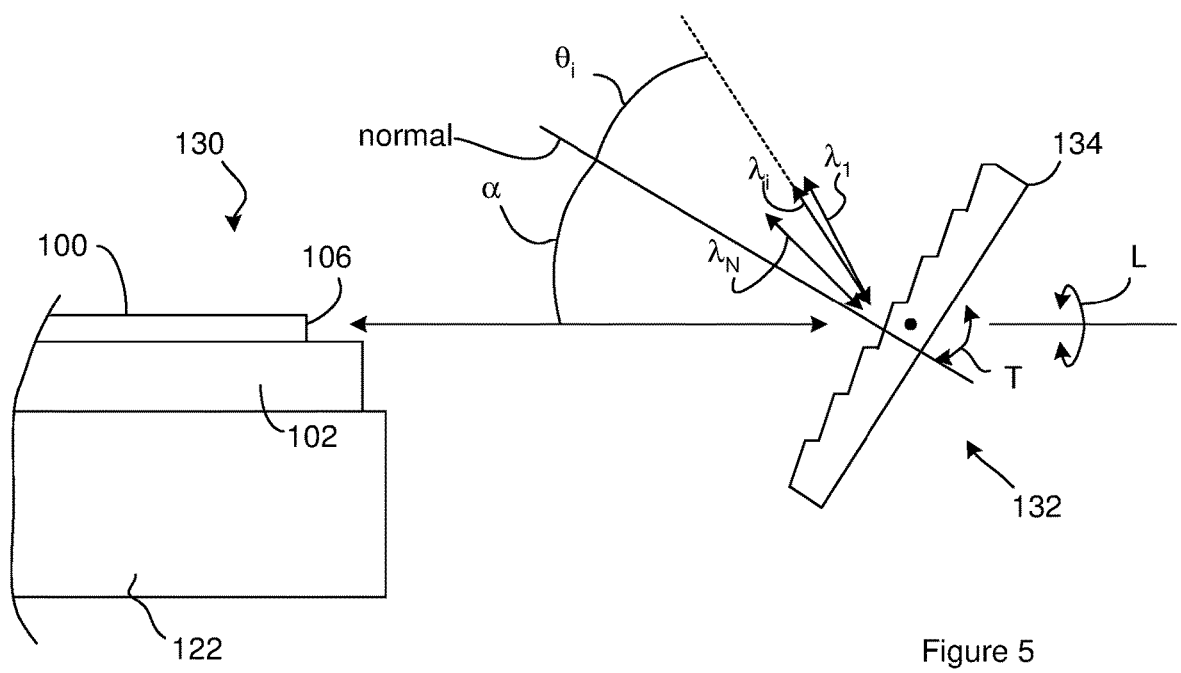
FIG. 5 is a cross section of a LIDAR system that includes a LIDAR assembly in optical communication with a directional component that includes a reflective optical grating.

A LIDAR system can include the LIDAR assembly 130 employed in conjunction with a directional component 132. The directional component 132 can be configured to separate the channels in the LIDAR output signal into LIDAR output channels that each carries a different one of the channels. The directional component 132 can also be configured to steer each LIDAR output channel to multiple different sample regions in a field of view. FIG. 5 is a cross section of a LIDAR system that includes a LIDAR assembly 130 in optical communication with a directional component 132. The cross section is taken through the LIDAR output signal and perpendicular to the common support 122. The LIDAR assembly 130 can be constructed as disclosed above. For instance, the LIDAR assembly 130 can be constructed according to FIG. 4.

The directional component 132 includes an optical grating 134 configured to receive the LIDAR output signal from the LIDAR assembly 130. The optical grating 134 is a reflective optical grating 134 that reflects the LIDAR output signal such that the LIDAR output signal is demultiplexed into LIDAR output channels. Each of the LIDAR output channels carries one of the channels that are labeled $\lambda_i$ through $\lambda_N$ where N represents the number of channels output from the optical grating 134. The LIDAR output channels each travels away from the optical grating 134 in a different direction. When all or a portion of the LIDAR output channels are reflected by an object in the path of the LIDAR output channel, a portion of the reflected light returns to the optical grating 134 as a LIDAR input channel. The optical grating 134 is configured to multiplex the LIDAR input channels into the LIDAR return signal that is received by the LIDAR assembly 130. Suitable reflective optical gratings 134 include, but are not limited to, ruled diffraction gratings, holographic diffraction gratings, and digital planar holographic diffraction gratings.

Figure 6:
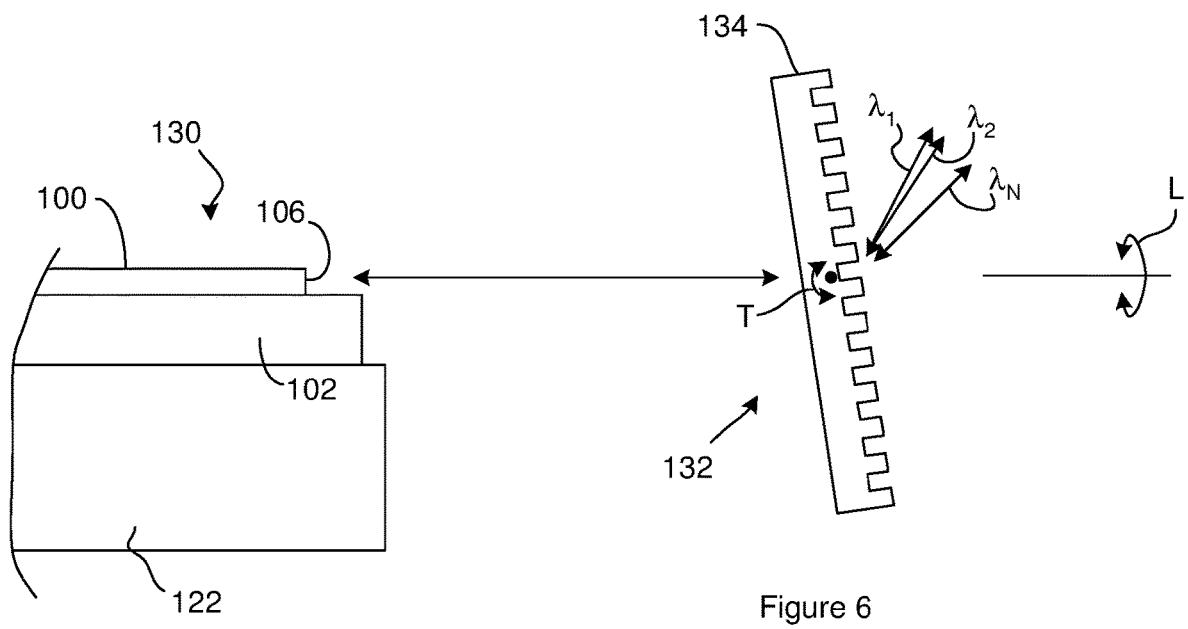
FIG. 6 is a cross section of a LIDAR system that includes a LIDAR assembly in optical communication with a directional component that includes a transmissive optical grating.

The optical grating 134 can be a transmissive optical grating 134. For instance, FIG. 6 is a cross section of a LIDAR system having a LIDAR assembly 130 and a directional component 132 that includes a transmissive optical grating 134. The cross section is taken through the LIDAR output signal and perpendicular to the common support 122. The LIDAR assembly 130 can be constructed as disclosed above. For instance, the LIDAR assembly 130 can be constructed according to FIG. 4.

The transmissive optical grating 134 receives the LIDAR output signal from the LIDAR assembly 130. The LIDAR output signal is transmitted through the optical grating 134 and output from the optical grating 134 such that the LIDAR output signal is demultiplexed into LIDAR output channels labeled $\lambda_i$ through $\lambda_N$. The LIDAR output channels each travels away from the optical grating 134 in a different direction ($\theta_i$). When all or a portion of the LIDAR output channels are reflected by an object in the path of the LIDAR output channel, a portion of the reflected light returns to the optical grating 134 as a LIDAR input channel. The optical grating 134 is configured to multiplex the LIDAR input channels into the LIDAR return signal that is received by the LIDAR assembly 130. Suitable transmissive optical gratings 134 include, but are not limited to, ruled diffraction gratings, holographic diffraction gratings, and digital planar holographic diffraction gratings.

The optical gratings 134 can be rotated in one or more directions in order to steer the direction that the LIDAR output channels travel away from the optical grating 134. The one or more rotations of the optical grating 134 can be performed by motors and/or actuation mechanism including, but not limited to, motors such as electromagnetic motors and piezoelectric motors.

In some instances, the optical grating 134 can be rotated such that the angle of incidence ($\alpha$) of the LIDAR input signal on the optical grating 134 does not change or does not change substantially. For instance, the optical grating 134 can be rotated around an axis that is parallel to the direction of the LIDAR output signal and includes the location where the direction of the LIDAR output signal is incident on the optical grating 134 (the incident axis) as illustrated by the arrow labeled L in FIG. 5 and FIG. 6. Since the angle of incidence ($\alpha$) does not substantially change during these rotations, the angular direction each LIDAR output channel travels away from the optical grating 134 ($\theta_i$) remains constant or substantially constant.

Additionally or alternately, the optical gating can be rotated so as to change the angle of incidence ($\alpha$) of the LIDAR input signal on the optical grating 134. For instance, the optical grating 134 can be rotated around a transverse axis that is perpendicular to the incident axis and parallel to a plane of the optical grating 134 and/or extends through the optical grating 134 as illustrated by the arrow labeled T in FIG. 5 and FIG. 6. In some instances, the transverse axis is selected such that the location where the direction of the LIDAR output signal is incident on the optical grating 134 does not change or does not change substantially during the rotation in order to reduce possible movement of a portion of the LIDAR output signal off the optical grating. Since the angle of incidence ($\alpha$) changes during this rotation, the angular direction that each LIDAR output channel travels away from the optical grating 134 ($\theta_i$) changes in response to the rotation.

The directional component 132 can optionally include one or more active and/or one or more passive optical components between the optical grating 134 and the LIDAR assembly 130. Examples of suitable passive optical components include, but are not limited to, optical fibers, lenses, mirrors, polarizers, polarization splitters, and wave plates. Active components include components where electrical energy is applied to and/or received from the component in order for the optical component to provide its intended function. Examples of suitable active optical components include, but are not limited to, amplifiers 140, actuated mirrors, and actuated lenses.

Figure 7:
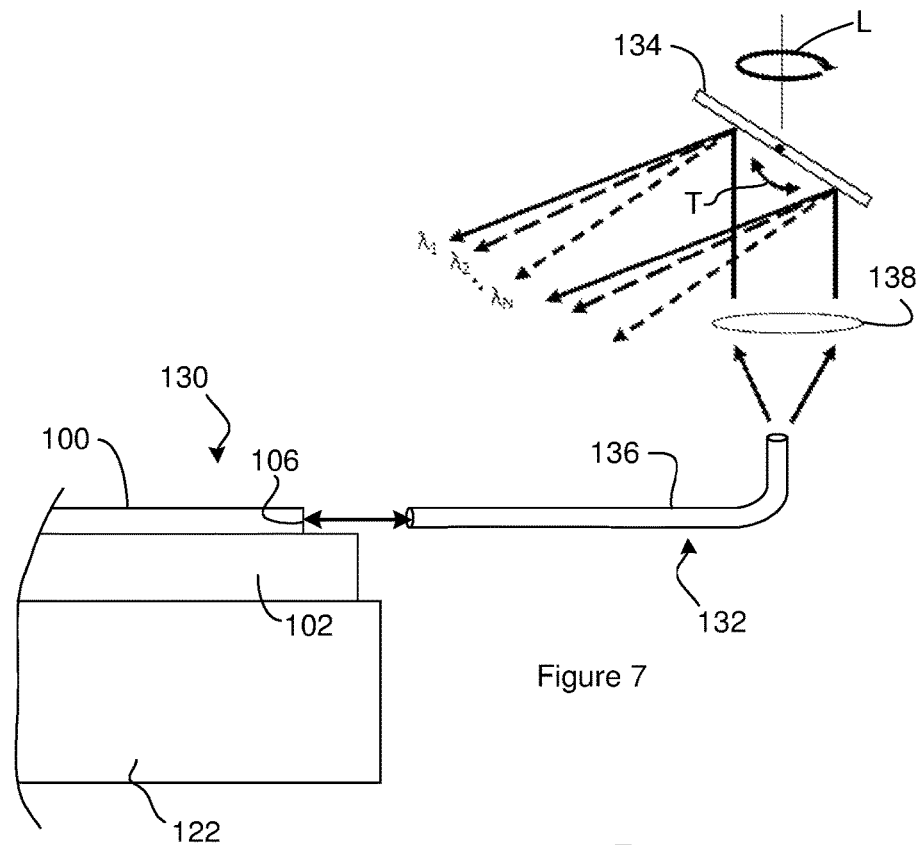
FIG. 7 is a cross section of the LIDAR system of FIG. 5 modified to include passive optical components and active optical components between the LIDAR assembly and the optical grating.

FIG. 7 is a cross section of the LIDAR system of FIG. 5 modified to include passive optical components and active optical components between the LIDAR assembly 130 and an optical grating 134. An optical fiber 136 receives the LIDAR output signal from the LIDAR assembly 130. The optical fiber 136 guides the LIDAR output signal to a lens 138. The lens 138 collimates the LIDAR output signal and the optical grating 134 receives the collimated LIDAR output signal. Collimating the LIDAR output signal allows the beam size and accordingly, the resolution, to be maintained at a constant or substantially constant level over a given range.

The electronics can use the rotations of the optical grating 134 to steer the direction of the LIDAR output channels of FIG. 5 through FIG. 7. For instance, rotations around the incident axis can be used to steer the LIDAR output channels into the page or out of the page and can be performed to adjust the direction of the LIDAR output channels over a range that is less than or equal to 360° range. Rotations around the transverse axis can move the LIDAR output channels up and down on the page.

Rotations of an optical grating 134 around a transverse axis as shown FIG. 5 through FIG. 7 can change the angle of incidence of the LIDAR output signal on the optical grating 134. As a result, these rotations change the efficiency of the optical grating 134. In some instances where reduced efficiency is not desirable, the optical grating 134 is rotated around one or more transverse axes over a range of angles selected such that the difference between the largest incident angle and the lowest incident angle is less than or equal to 10°, 20°, or 30°.

Figure 8:
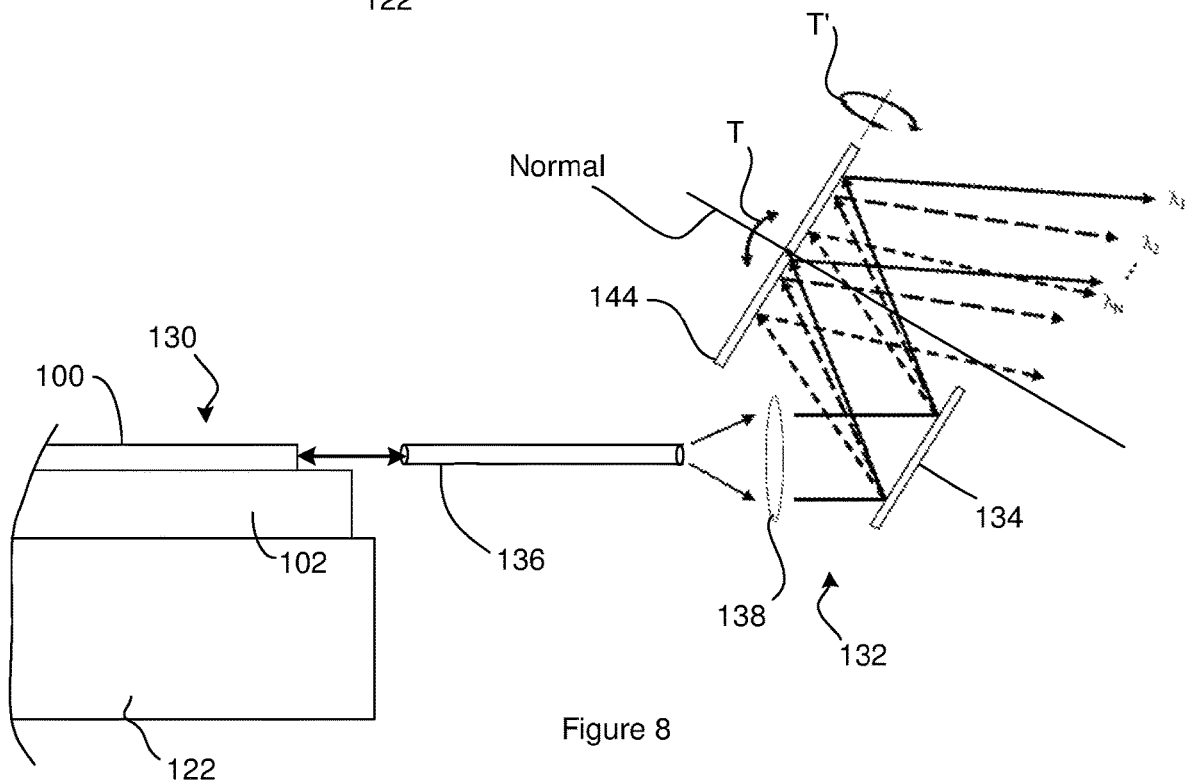
FIG. 8 is a cross section of the LIDAR system of FIG. 7 modified to include a mirror positioned to receive LIDAR output channels from the optical grating.

The one or more active and/or one or more passive optical components can be located after the optical grating 134 in that the component(s) located after the optical grating 134 operate on the LIDAR output channels after demultiplexing by the optical grating 134. For instance, FIG. 8 is a cross section of the LIDAR system of FIG. 7 modified to include a mirror 144 positioned to receive the LIDAR output channels from the optical grating 134. The mirror 144 can be an active mirror 144 in that the electronics can rotate the mirror 144 in one or more directions in order to steer the direction that the LIDAR output channels travel away from the mirror 144. The one or more rotations of the optical grating 134 can be performed by motors and/or actuation mechanism including, but not limited to, motors such as electromagnetic motors and piezoelectric motors.

The mirror 144 can be rotated so as to change the angle of incidence of the LIDAR input signal on the mirror 144. For instance, the mirror 144 can be rotated around one or more transverse axes that are perpendicular to the normal axis and is parallel to a plane of the mirror 144 and/or extends through the mirror 144. In FIG. 8, the mirror 144 has two-dimensional movement in that the mirror 144 can be rotated both the transverse axes labeled T and the transverse axes labeled T'. Since the angle of incidence for each channel ($\alpha_i$) change during this rotation, the angular direction each LIDAR output channel travels away from the optical grating 134 ($\theta_i$) can changes.

The electronics can use the rotations of the mirror 144 to steer the direction of the LIDAR output channels. For instance, rotations of the mirror 144 around the transverse axis labeled T can move the LIDAR output channels up and down on the page while rotations around the transverse axis labeled T' can move the LIDAR output channels into and out of the page.

The optical grating 134 in the directional component 132 of FIG. 8 can remain stationary while tuning the directions of the LIDAR output channels. As a result, the angle of incidence between the LIDAR input signal and the optical grating 134 does not change allowing the efficiency of the optical grating 134 to remain constant during operation of the directional component 132.

Figure 9A:
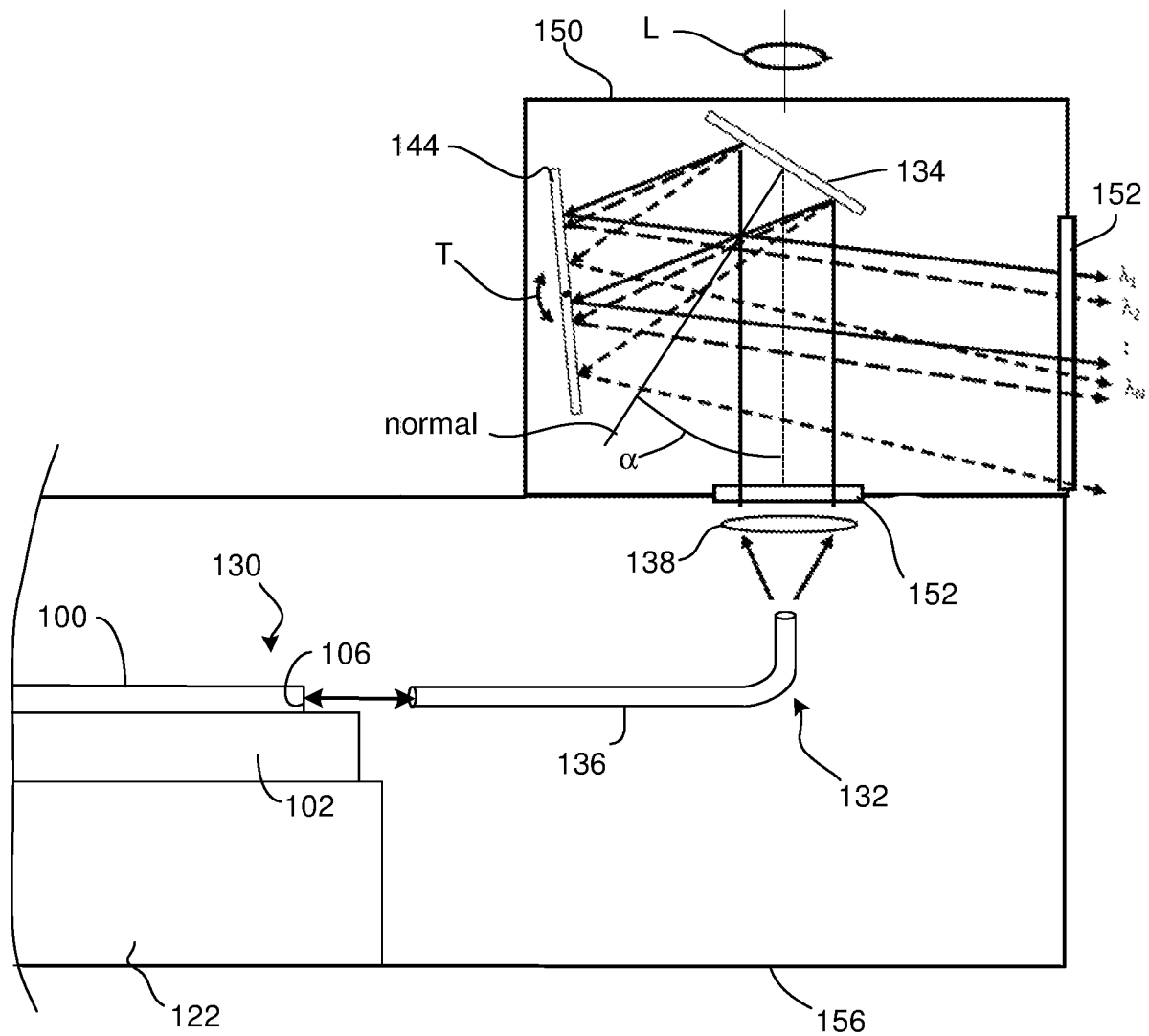
FIG. 9A illustrates the LIDAR system of FIG. 8 modified such that the optical grating is rotated around one or more axes.

In some instances, the mirror 144 and the optical grating 134 can each be rotated around one or more axes. For instance, FIG. 9A illustrates the LIDAR system of FIG. 8 modified such that the optical grating 134 is rotated around one or more axes and the mirror 144 has one dimensional movement in that the mirror 144 can be rotated around one or more axes to steer the direction that the LIDAR output channels travel away from the directional component 132. For instance, the optical grating 134 can be rotated such that the angle of incidence ($\alpha$) of the LIDAR input signal on the optical grating 134 does not change or does not change substantially. As an example, the optical grating 134 can be rotated around an axis that is parallel to the direction of the LIDAR output signal and includes the location where the direction of the LIDAR output signal strikes the optical grating 134 (the incident axis) as illustrated by the arrow labeled L in FIG. 9A. Since the angle of incidence ($\alpha$) does not substantially change during this rotation, the angular direction each LIDAR output channel travels away from the optical grating 134 ($\theta_i$) remains constant or substantially constant during the rotation.

Figure 9B:
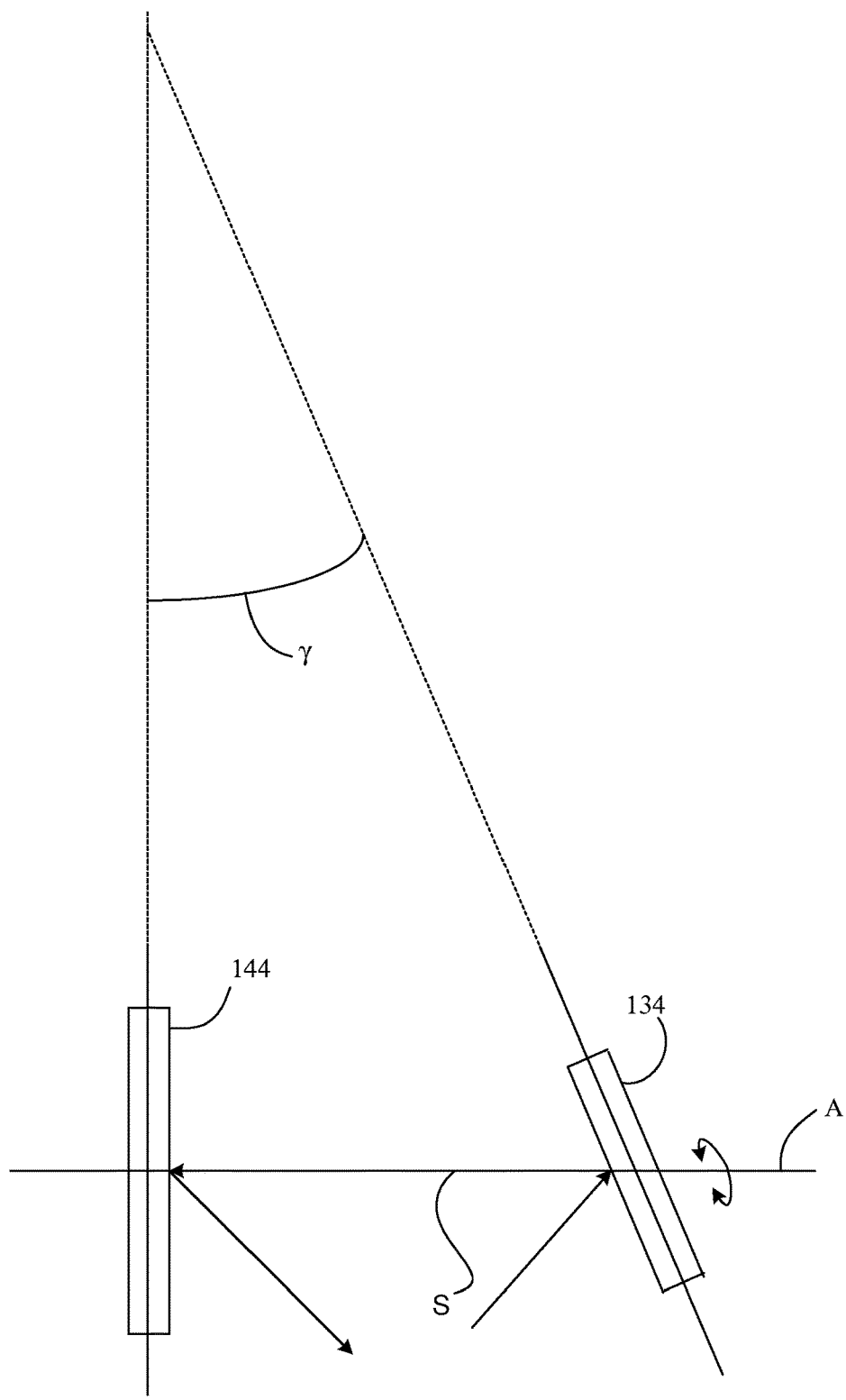
FIG. 9B is a diagram illustrating changes in separation, angular orientation, and the rotational orientation between a mirror and optical grating.

The mirror 144 receives the LIDAR output channels from the optical grating 134. The mirror 144 is configured such that the location where the LIDAR output channels are incident on the mirror 144 do not change or do not substantially change in response to rotation of the optical axis around the incident axis. For instance, the mirror 144 and the optical grating 134 in FIG. 9A are positioned in a housing 150. The housing 150 includes windows 152 through which the LIDAR output signal and the LIDAR input channels enter the housing 150 and the LIDAR input signal, the LIDAR output channels exit the housing 150. The mirror 144 the optical grating 134 can be attached to a housing 150 such that rotation of the housing 150 around the incident axis rotates the optical grating 134 around the incident axis. The rotation of the housing 150 around the incident axis also rotates the mirror 144 around the incident axis. This mirror 144 is configured such that the location where the LIDAR output channels ($\lambda_i$) are incident on the mirror 144 do not change or do not substantially change in response to rotation of the housing 150 and optical grating 134 around the incident axis. For instance, the mirror 144 and the optical grating 134 can be attached to the housing 150 such that the separation, the angular orientation, and the rotational orientation between the mirror 144 and the optical grating 134 do not change in response to rotation of the optical grating 134. Changes to the separation labeled S in FIG. 9B would represent a change in the separation between the mirror 144 and the optical grating 134. Changes to the angle γ in FIG. 9B would represent a change to the angular orientation between the mirror 144 and the optical grating 134. Unequal rotation of the optical grating 134 and the mirror 144 relative to one another around the axis labeled A in FIG. 9B would represent a change in the rotational orientation. In FIG. 9A, the housing 150 maintains the separation, angular orientation, and rotational orientation during rotation of the optical grating 134 around the incident axis, however, other mechanisms and/or structures can be employed to maintain these variables in response to rotation of the optical grating 134 around the incident axis. For instance, the optical grating 134 and mirror 144 can be connected to one or more structures selected from the group consisting of frames, platforms, and other immobilizing structures.

In some instances, the mirror 144 is an active mirror 144 in that the electronics can rotate the mirror 144 in one dimension or two dimensions. For instance, the mirror 144 can be rotated so as to change the angle of incidence of the LIDAR input signal on the mirror 144. As an example, the mirror 144 can be rotated around one or more transverse axes that are perpendicular to the normal axis and is parallel to a plane of the mirror 144 and/or extends through the mirror 144 as illustrated by the axes labeled T in FIG. 9A. Since the angle of incidence for each channel ($\alpha_i$) change during this rotation, the angular direction each LIDAR output channel travels away from the optical grating 134 ($\theta_i$) can changes.

The electronics can use the rotations of the mirrors 144 and/or the optical grating 134 to steer the directions of the LIDAR output channels. For instance, rotations of the optical grating 134 around the incident axis can be used to steer the LIDAR output channels into the page or out of the page and can be performed to adjust the direction of the LIDAR output channels over a 360° range. Rotations of the mirror 144 around the transverse axis can move the LIDAR output channels up and down on the page.

When steering the LIDAR output channels in the LIDAR system of FIG. 9A, the optical grating 134 need not be rotated around a transverse axis. As a result, the angle of incidence of the LIDAR output signal on the optical grating 134 does not change and the grating efficiency is preserved.

Although FIG. 9A illustrates a particular embodiment of the directional component 132 used in conjunction with the housing 150 and case 156, the LIDAR systems illustrated in FIG. 5 through FIG. 8 can be located in a housing 150 and case 156. For instance, an optical grating 134 and any active passive mirror 144 used in steering the LIDAR output channels in the LIDAR systems of FIG. 5 through FIG. 8 can be located in a housing 150. Although the LIDAR system illustrated in FIG. 9A illustrates a mirror 144 and optical grating 134 positioned in the housing 150 and shows the LIDAR assembly 130 and other components of the directional component 132 positioned in a case 156, the distribution of different components between the case 156 and the housing 150 can be changed. For instance, additional components can be moved from the case 156 into the house. In some instances, one or more motors (not shown) can be positioned in the housing 150 and/or the case 156. The one or more motors can be configured to actuate one or more components selected from the group consisting of the housing 150, the optical grating 134 and/or one or more active mirrors 144. Although the case 156 is shown as being in contact with the housing 150, the case 156 can be remote from the housing 150. When the case 156 is remote from the housing 150, the optical fiber 136 can carry LIDAR input signals and/or LIDAR output signals between the case 156 and the housing 150.

As noted above, the LIDAR chips include one or more waveguides that constrains the optical path of one or more light signals. While the directional component can include waveguides, the optical path that the LIDAR return signal, the LIDAR output signal, the LIDAR output channels and/or the LIDAR input channels travel between components on the directional component and/or between the directional component and a component on the LIDAR adapter can be free space. For instance, the LIDAR return signal, the LIDAR output signal, the LIDAR output channels and/or the LIDAR input channels can travel through the atmosphere in which the LIDAR chip, the LIDAR adapter, the directional component and/or the base 102 is positioned.

Figure 10:
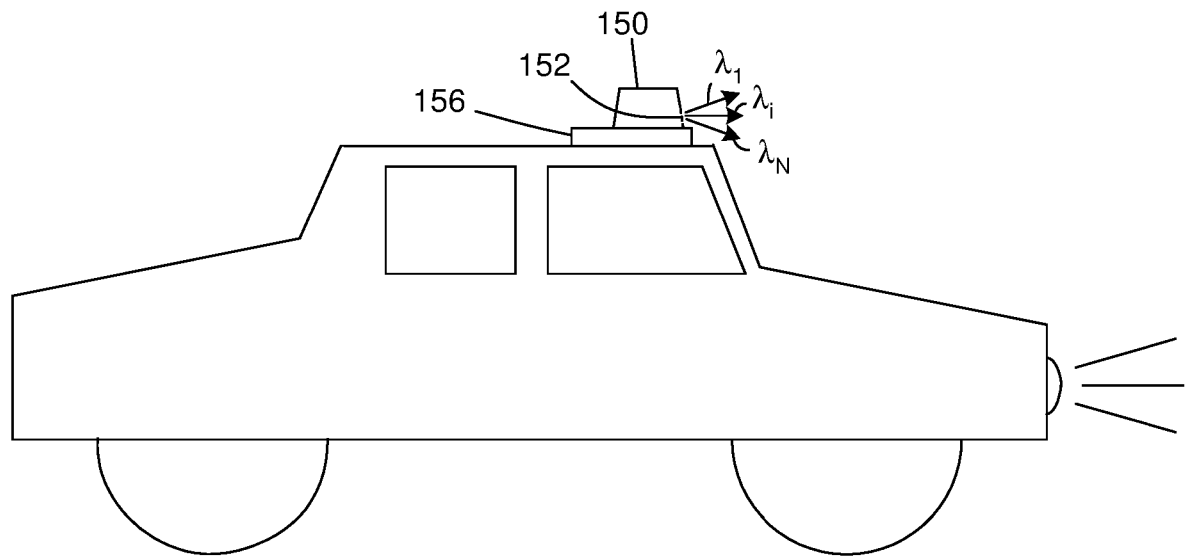
FIG. 10 is a diagram illustrating a LIDAR system positioned on a car.

A possible application of the LIDAR system is in self-driving vehicles including passenger vehicles and cargo vehicles. FIG. 10 is a diagram of a LIDAR system constructed as disclosed above positioned on a car. The housing 150 and case 156 can be positioned on the car. Although the case 156 is shown as being positioned between the vehicle and the housing 150, the case 156 can be positioned elsewhere in vehicle such as in the trunk of a car.

The ability of the housing 150 to output multiple LIDAR output channels that can be scanned over 360° and to scan the LIDAR output channels vertically without reducing grating efficiency allows LIDAR data to be generated for the full field of view around the vehicle.

Figure 11:
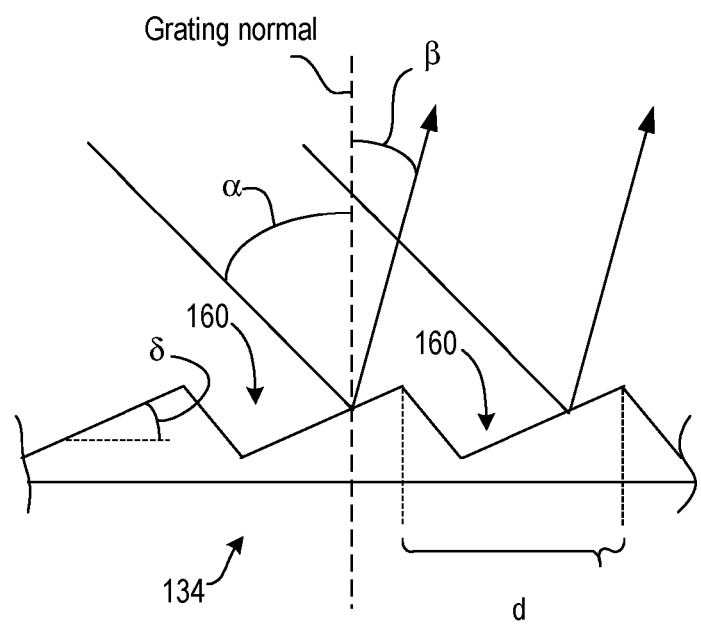
FIG. 11 illustrates a portion of a suitable reflective optical grating that includes multiple grooves.

FIG. 11 illustrates a portion of a suitable reflective optical grating 134 that includes multiple grooves 160. The level of dispersion for the grating is a measure of the degree to which different channels separate as they travel away from the grating and can be expressed as $d\beta/d\lambda$ where $\lambda$ represents wavelength and $\beta$ represents the angle of reflection as shown in FIG. 11. At the wavelengths and distances used in many LIDAR applications, suitable dispersion levels include, but are not limited to, dispersion levels greater than 0.05°/nm, or 0.1°/nm and/or less than 0.15°/nm, or 0.2° nm. The level of dispersion increases with increasing grating order, decreasing grating spacing (labeled d in FIG. 11), and increasing angle of incidence ($\alpha$). Additionally, the grating efficiency increases as the blaze angle (labeled $\delta$) increases. In some instances, the grating has all or a portion of the features selected from the group consisting of an order greater than 10, 20, or 50 and/or less than 100, 200, or 300; a grating spacing (d) greater than 5 µm, 10 µm, or 20 µm and/or less than 25 µm, 30 µm, or 40 µm; an angle of incidence maintained in a range of 40° to 60° or 20° to 40°; a blaze angle greater than 10°, 20°, or 30° and/or less than 40°, 50°, or 60°; and receives a LIDAR input signal carrying multiple channels having wavelengths less than 1640 nm, 1600 nm, or 1550 nm and greater than 1450 nm, 1350 nm, or 1250 nm. In one example, the grating has an order of 20; a grating spacing (d) of 21 µm; an angle of incidence of 40°; a blaze angle ($\delta$) of 48°; receives a LIDAR input signal carrying multiple channels having wavelengths less than 1570 nm and greater than 1538 nm.

Figure 12A:
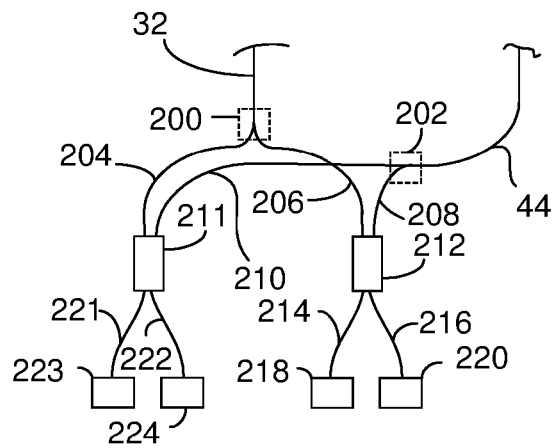
FIG. 12A illustrates an example of a processing unit suitable for use with the LIDAR system of FIG. 1.
Figure 12B:
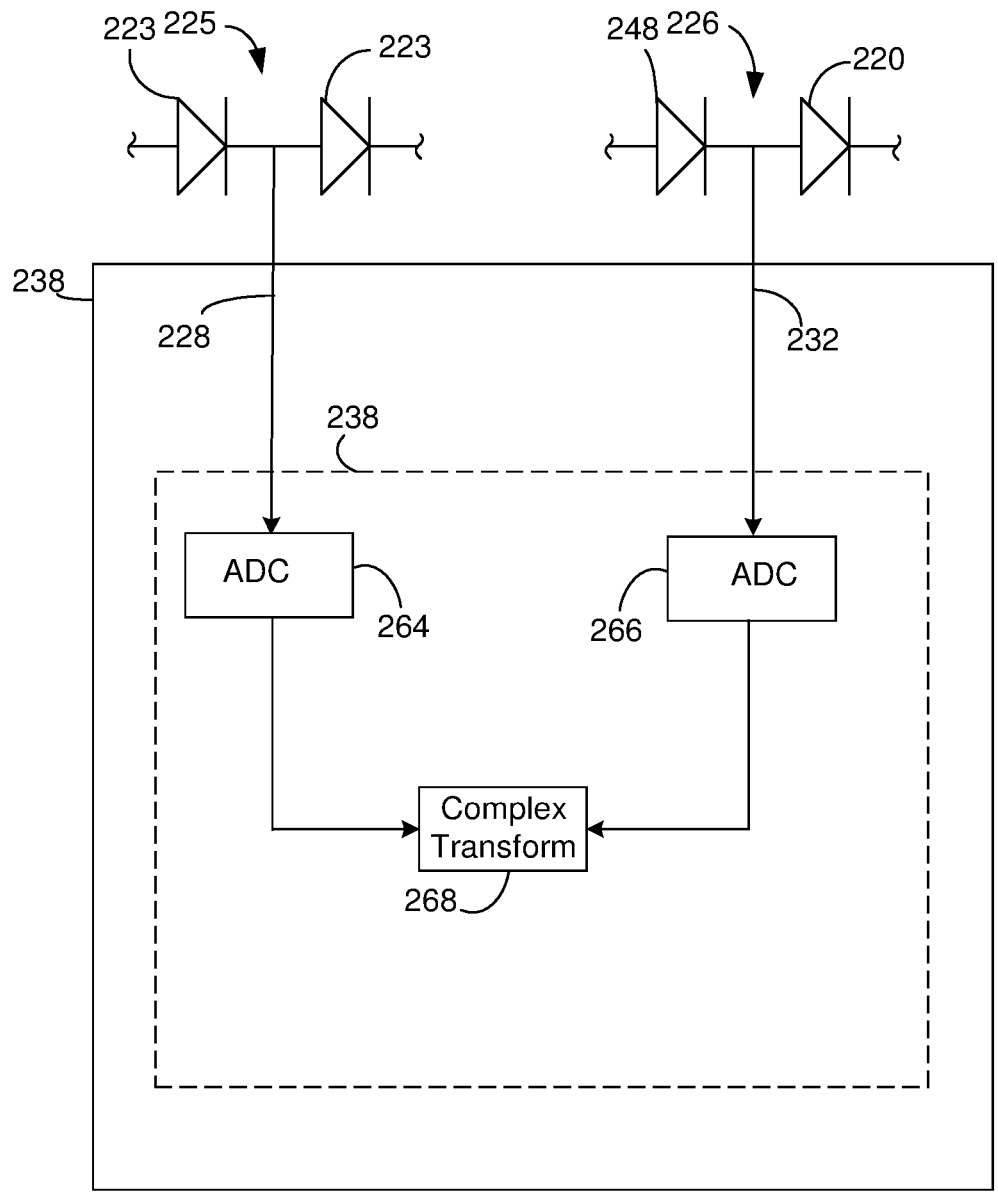
FIG. 12B provides a schematic of electronics that are suitable for use with a processing unit constructed according to FIG. 12A.

FIG. 12A through FIG. 12B illustrate an example of a suitable processing component 34 for use as one of the processing components 34 in the above LIDAR assemblies. As described in the context of FIG. 1, each processing component 34 receives a comparative signal from a comparative waveguide 32 and a reference signal from a reference waveguide 40. The processing unit includes a second splitter 200 that divides the comparative signal carried on the comparative waveguide 32 onto a first comparative waveguide 204 and a second comparative waveguide 206. The first comparative waveguide 204 carries a first portion of the comparative signal to the light-combining component 211. The second comparative waveguide 208 carries a second portion of the comparative signal to the second light-combining component 212.

The second light-combining component 212 combines the second portion of the comparative signal and the second portion of the reference signal into a second composite signal. Due to the difference in frequencies between the second portion of the comparative signal and the second portion of the reference signal, the second composite signal is beating between the second portion of the comparative signal and the second portion of the reference signal.

The second light-combining component 212 also splits the resulting second composite signal onto a first auxiliary detector waveguide 214 and a second auxiliary detector waveguide 216. The first auxiliary detector waveguide 214 carries a first portion of the second composite signal to a first auxiliary light sensor 218 that converts the first portion of the second composite signal to a first auxiliary electrical signal. The second auxiliary detector waveguide 216 carries a second portion of the second composite signal to a second auxiliary light sensor 220 that converts the second portion of the second composite signal to a second auxiliary electrical signal. Examples of suitable light sensors include germanium photodiodes (PDs), and avalanche photodiodes (APDs).

In some instances, the second light-combining component 212 splits the second composite signal such that the portion of the comparative signal (i.e. the portion of the second portion of the comparative signal) included in the first portion of the second composite signal is phase shifted by 180° relative to the portion of the comparative signal (i.e. the portion of the second portion of the comparative signal) in the second portion of the second composite signal but the portion of the reference signal (i.e. the portion of the second portion of the reference signal) in the second portion of the second composite signal is not phase shifted relative to the portion of the reference signal (i.e. the portion of the second portion of the reference signal) in the first portion of the second composite signal. Alternately, the second light-combining component 212 splits the second composite signal such that the portion of the reference signal (i.e. the portion of the second portion of the reference signal) in the first portion of the second composite signal is phase shifted by 180° relative to the portion of the reference signal (i.e. the portion of the second portion of the reference signal) in the second portion of the second composite signal but the portion of the comparative signal (i.e. the portion of the second portion of the comparative signal) in the first portion of the second composite signal is not phase shifted relative to the portion of the comparative signal (i.e. the portion of the second portion of the comparative signal) in the second portion of the second composite signal. Examples of suitable light sensors include germanium photodiodes (PDs), and avalanche photodiodes (APDs).

The first light-combining component 211 combines the first portion of the comparative signal and the first portion of the reference signal into a first composite signal. Due to the difference in frequencies between the first portion of the comparative signal and the first portion of the reference signal, the first composite signal is beating between the first portion of the comparative signal and the first portion of the reference signal.

The light-combining component 211 also splits the first composite signal onto a first detector waveguide 221 and a second detector waveguide 222. The first detector waveguide 221 carries a first portion of the first composite signal to a first light sensor 223 that converts the first portion of the second composite signal to a first electrical signal. The second detector waveguide 222 carries a second portion of the second composite signal to a second auxiliary light sensor 224 that converts the second portion of the second composite signal to a second electrical signal. Examples of suitable light sensors include germanium photodiodes (PDs), and avalanche photodiodes (APDs).

In some instances, the light-combining component 211 splits the first composite signal such that the portion of the comparative signal (i.e. the portion of the first portion of the comparative signal) included in the first portion of the composite signal is phase shifted by 180° relative to the portion of the comparative signal (i.e. the portion of the first portion of the comparative signal) in the second portion of the composite signal but the portion of the reference signal (i.e. the portion of the first portion of the reference signal) in the first portion of the composite signal is not phase shifted relative to the portion of the reference signal (i.e. the portion of the first portion of the reference signal) in the second portion of the composite signal. Alternately, the light-combining component 211 splits the composite signal such that the portion of the reference signal (i.e. the portion of the first portion of the reference signal) in the first portion of the composite signal is phase shifted by 180° relative to the portion of the reference signal (i.e. the portion of the first portion of the reference signal) in the second portion of the composite signal but the portion of the comparative signal (i.e. the portion of the first portion of the comparative signal) in the first portion of the composite signal is not phase shifted relative to the portion of the comparative signal (i.e. the portion of the first portion of the comparative signal) in the second portion of the composite signal.

When the second light-combining component 212 splits the second composite signal such that the portion of the comparative signal in the first portion of the second composite signal is phase shifted by 180° relative to the portion of the comparative signal in the second portion of the second composite signal, the light-combining component 211 also splits the composite signal such that the portion of the comparative signal in the first portion of the composite signal is phase shifted by 180° relative to the portion of the comparative signal in the second portion of the composite signal. When the second light-combining component 212 splits the second composite signal such that the portion of the reference signal in the first portion of the second composite signal is phase shifted by 180° relative to the portion of the reference signal in the second portion of the second composite signal, the light-combining component 211 also splits the composite signal such that the portion of the reference signal in the first portion of the composite signal is phase shifted by 180° relative to the portion of the reference signal in the second portion of the composite signal.

The first reference waveguide 210 and the second reference waveguide 208 are constructed to provide a phase shift between the first portion of the reference signal and the second portion of the reference signal. For instance, the first reference waveguide 210 and the second reference waveguide 208 can be constructed so as to provide a 90 degree phase shift between the first portion of the reference signal and the second portion of the reference signal. As an example, one reference signal portion can be an in-phase component and the other a quadrature component. Accordingly, one of the reference signal portions can be a sinusoidal function and the other reference signal portion can be a cosine function. In one example, the first reference waveguide 210 and the second reference waveguide 208 are constructed such that the first reference signal portion is a cosine function and the second reference signal portion is a sine function. Accordingly, the portion of the reference signal in the second composite signal is phase shifted relative to the portion of the reference signal in the first composite signal, however, the portion of the comparative signal in the first composite signal is not phase shifted relative to the portion of the comparative signal in the second composite signal.

The first light sensor 223 and the second light sensor 224 can be connected as a balanced detector and the first auxiliary light sensor 218 and the second auxiliary light sensor 220 can also be connected as a balanced detector. For instance, FIG. 12B provides a schematic of the relationship between the electronics, the first light sensor 223, the second light sensor 224, the first auxiliary light sensor 218, and the second auxiliary light sensor 220. The symbol for a photodiode is used to represent the first light sensor 223, the second light sensor 224, the first auxiliary light sensor 218, and the second auxiliary light sensor 220 but one or more of these sensors can have other constructions. In some instances, all of the components illustrated in the schematic of FIG. 12B are included on the LIDAR chip. In some instances, the components illustrated in the schematic of FIG. 12B are distributed between the LIDAR chip and electronics located off of the LIDAR chip.

The electronics connect the first light sensor 223 and the second light sensor 224 as a first balanced detector 225 and the first auxiliary light sensor 218 and the second auxiliary light sensor 220 as a second balanced detector 226. In particular, the first light sensor 223 and the second light sensor 224 are connected in series. Additionally, the first auxiliary light sensor 218 and the second auxiliary light sensor 220 are connected in series. The serial connection in the first balanced detector is in communication with a first data line 228 that carries the output from the first balanced detector as a first data signal. The serial connection in the second balanced detector is in communication with a second data line 232 that carries the output from the second balanced detector as a second data signal. The first data signal is an electrical representation of the first composite signal and the second data signal is an electrical representation of the second composite signal. Accordingly, the first data signal includes a contribution from a first waveform and a second waveform and the second data signal is a composite of the first waveform and the second waveform. The portion of the first waveform in the first data signal is phase-shifted relative to the portion of the first waveform in the first data signal but the portion of the second waveform in the first data signal being in-phase relative to the portion of the second waveform in the first data signal. For instance, the second data signal includes a portion of the reference signal that is phase shifted relative to a different portion of the reference signal that is included the first data signal. Additionally, the second data signal includes a portion of the comparative signal that is in-phase with a different portion of the comparative signal that is included in the first data signal. The first data signal and the second data signal are beating as a result of the beating between the comparative signal and the reference signal, i.e. the beating in the first composite signal and in the second composite signal.

The electronics 62 includes a transform mechanism 238 configured to perform a mathematical transform on the first data signal and the second data signal. For instance, the mathematical transform can be a complex Fourier transform with the first data signal and the second data signal as inputs. Since the first data signal is an in-phase component and the second data signal its quadrature component, the first data signal and the second data signal together act as a complex data signal where the first data signal is the real component and the second data signal is the imaginary component of the input.

The transform mechanism 238 includes a first Analog-to-Digital Converter (ADC) 264 that receives the first data signal from the first data line 228. The first Analog-to-Digital Converter (ADC) 264 converts the first data signal from an analog form to a digital form and outputs a first digital data signal. The transform mechanism 238 includes a second Analog-to-Digital Converter (ADC) 266 that receives the second data signal from the second data line 232. The second Analog-to-Digital Converter (ADC) 266 converts the second data signal from an analog form to a digital form and outputs a second digital data signal. The first digital data signal is a digital representation of the first data signal and the second digital data signal is a digital representation of the second data signal. Accordingly, the first digital data signal and the second digital data signal act together as a complex signal where the first digital data signal acts as the real component of the complex signal and the second digital data signal acts as the imaginary component of the complex data signal.

The transform mechanism 238 includes a transform component 268 that receives the complex data signal. For instance, the transform component 268 receives the first digital data signal from the first Analog-to-Digital Converter (ADC) 264 as an input and also receives the second digital data signal from the first Analog-to-Digital Converter (ADC) 266 as an input. The transform component 268 can be configured to perform a mathematical transform on the complex signal so as to convert from the time domain to the frequency domain. The mathematical transform can be a complex transform such as a complex Fast Fourier Transform (FFT). A complex transform such as a complex Fast Fourier Transform (FFT) provides an unambiguous solution for the shift in frequency of LIDAR input signal relative to the LIDAR output signal that is caused by the radial velocity between the reflecting object and the LIDAR chip. The electronics use the one or more frequency peaks output from the transform component 268 for further processing to generate the LIDAR data (distance and/or radial velocity between the reflecting object and the LIDAR chip or LIDAR system). The transform component 268 can execute the attributed functions using firmware, hardware or software or a combination thereof.

Figure 12C:
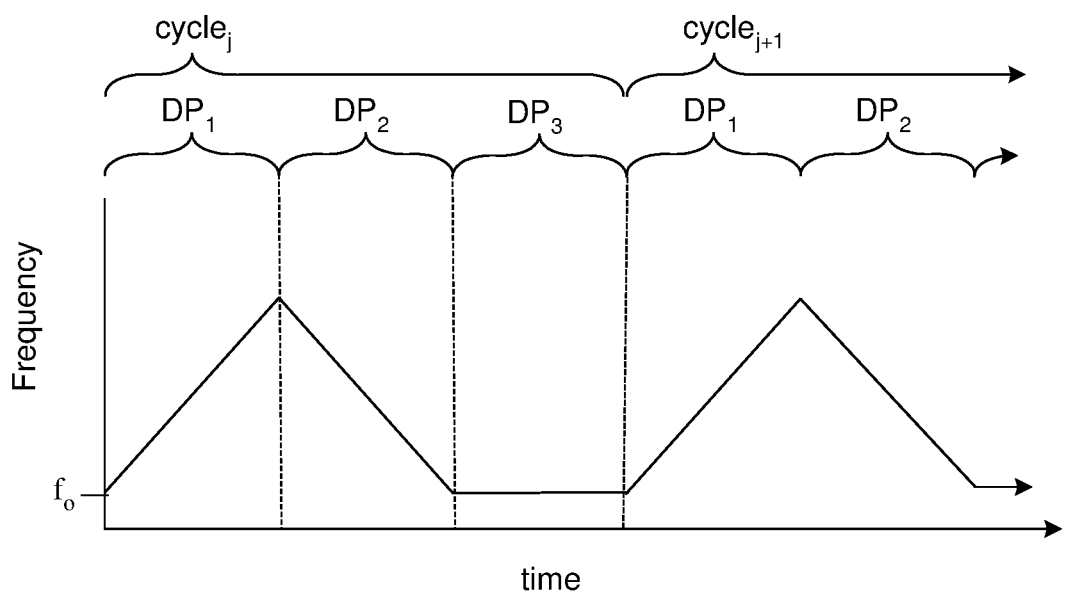
FIG. 12C is a graph of frequency versus time for one of the channels included in a LIDAR output signal.

FIG. 12C shows an example of a relationship between the frequency of the LIDAR output signal, time, cycles and data periods. Although FIG. 12C shows frequency versus time for only one channel, the illustrated frequency versus time pattern represent the frequency versus time for each of the channels. The base frequency of the LIDAR output signal ($f_o$) can be the frequency of the LIDAR output signal at the start of a cycle.

FIG. 12C shows frequency versus time for a sequence of two cycles labeled cycle$_j$ and cycle$_{j+1}$. In some instances, the frequency versus time pattern is repeated in each cycle as shown in FIG. 12C. The illustrated cycles do not include re-location periods and/or re-location periods are not located between cycles. As a result, FIG. 12C illustrates the results for a continuous scan.

Each cycle includes K data periods that are each associated with a period index k and are labeled $DP_k$. In the example of FIG. 12C, each cycle includes three data periods labeled $DP_k$ with k=1, 2, and 3. In some instances, the frequency versus time pattern is the same for the data periods that correspond to each other in different cycles as is shown in FIG. 12C. Corresponding data periods are data periods with the same period index. As a result, each data period $DP_1$ can be considered corresponding data periods and the associated frequency versus time patterns are the same in FIG. 12C. At the end of a cycle, the electronics return the frequency to the same frequency level at which it started the previous cycle.

During the data period $DP_1$, and the data period $DP_2$, the electronics operate the light source such that the frequency of the LIDAR output signal changes at a linear rate $\alpha$. The direction of the frequency change during the data period $DP_1$ is the opposite of the direction of the frequency change during the data period $DP_2$.

The frequency output from the Complex Fourier transform represents the beat frequency of the composite signals that each includes a comparative signal beating against a reference signal. The beat frequencies ($f_{LDP}$) from two or more different data periods can be combined to generate the LIDAR data. For instance, the beat frequency determined from $DP_1$ in FIG. 12C can be combined with the beat frequency determined from $DP_2$ in FIG. 12C to determine the LIDAR data. As an example, the following equation applies during a data period where electronics increase the frequency of the outgoing LIDAR signal during the data period such as occurs in data period $DP_1$ of FIG. 12C: $f_{ub}=-f_d+\alpha\tau$ where $f_{ub}$ is the frequency provided by the transform component ($f_{LDP}$ determined from $DP_1$ in this case), $f_d$ represents the Doppler shift ($f_d=2vf_c/c$) where $f_c$ represents the optical frequency ($f_o$), c represents the speed of light, v is the radial velocity between the reflecting object and the LIDAR system where the direction from the reflecting object toward the chip is assumed to be the positive direction, and c is the speed of light. The following equation applies during a data period where electronics decrease the frequency of the outgoing LIDAR signal such as occurs in data period $DP_2$ of FIG. 12C: $f_{db}=-f_d-\alpha\tau$ where $f_{db}$ is a frequency provided by the transform component ($f_{i,\ LDP}$ determined from $DP_2$ in this case). In these two equations, $f_d$ and $\tau$ are unknowns. The electronics solve these two equations for the two unknowns. The radial velocity for the sample region then be determined from the Doppler shift ($v=c*f_d/(2f_c)$) and/or the separation distance for that sample region can be determined from $c*f_\tau/2$. Since the LIDAR data can be generated for each corresponding frequency pair output by the transform, separate LIDAR data can be generated for each of the objects in a sample region. Accordingly, the electronics can determine more than one radial velocity and/or more than one radial separation distance from a single sampling of a single sample region in the field of view.

The data period labeled $DP_3$ in FIG. 12C is optional. As noted above, there are situations where more than one object is present in a sample region. For instance, during the feedback period in $DP_1$ for $cycle_2$ and also during the feedback period in $DP_2$ for $cycle_2$, more than one frequency pair can be matched. In these circumstances, it may not be clear which frequency peaks from $DP_2$ correspond to which frequency peaks from $DP_1$. As a result, it may be unclear which frequencies need to be used together to generate the LIDAR data for an object in the sample region. As a result, there can be a need to identify corresponding frequencies. The identification of corresponding frequencies can be performed such that the corresponding frequencies are frequencies from the same reflecting object within a sample region. The data period labeled $DP_3$ can be used to find the corresponding frequencies. LIDAR data can be generated for each pair of corresponding frequencies and is considered and/or processed as the LIDAR data for the different reflecting objects in the sample region.

An example of the identification of corresponding frequencies uses a LIDAR system where the cycles include three data periods ($DP_1$, $DP_2$, and $DP_3$) as shown in FIG. 12C. When there are two objects in a sample region illuminated by the LIDAR outputs signal, the transform component outputs two different frequencies for $f_{ub}$: $f_{u1}$ and $f_{u2}$ during $DP_1$ and another two different frequencies for $f_{db}$: $f_{d1}$ and $f_{d2}$ during $DP_2$. In this instance, the possible frequency pairings are: ($f_{d1}$, $f_{u1}$); ($f_{d1}$, $f_{u2}$); ($f_{d2}$, $f_{u1}$); and ($f_{d2}$, $f_{du2}$). A value of $f_d$ and $\tau$ can be calculated for each of the possible frequency pairings. Each pair of values for $f_d$ and $\tau$ can be substituted into $f_3=-f_d+\alpha_3\tau_0$ to generate a theoretical $f_3$ for each of the possible frequency pairings. The value of $\alpha_3$ is different from the value of $\alpha$ used in $DP_1$ and $DP_2$. In FIG. 12C, the value of $\alpha_3$ is zero. In this case, the transform components also outputs two values for $f_3$ that are each associated with one of the objects in the sample region. The frequency pair with a theoretical $f_3$ value closest to each of the actual $f_3$ values is considered a corresponding pair. LIDAR data can be generated for each of the corresponding pairs as described above and is considered and/or processed as the LIDAR data for a different one of the reflecting objects in the sample region. Each set of corresponding frequencies can be used in the above equations to generate LIDAR data. The generated LIDAR data will be for one of the objects in the sample region. As a result, multiple different LIDAR data values can be generated for a sample region where each of the different LIDAR data values corresponds to a different one of the objects in the sample region.

The LIDAR data results described in the context of FIG. 12A through FIG. 12C are generated by a single processing unit 34. However, as described above, the LIDAR system includes multiple processing units 34 that each receives a different channel. As a result, when different channels are concurrently directed to different sample regions in a field of view, the LIDAR results generated by the processing units 34, the LIDAR results are each associated with a different sample region in the field of view.

Example 1

An autonomous car LIDAR system application outputs N=32 LIDAR output channels and uses an angular resolution of at most 0.1° for a field of view covering cover 30° in the vertical direction and 60° in the horizontal direction with a maximum distance of 200 m, and a field of view update rate of 30 Hz and. With these conditions, the required number of sample regions measured per second is 300×600×30=5.4 M sample regions/s, which corresponds to a measurement time of 1/5.4M=0.185 μs per sample region. With three data periods in each cycle, each data period can be ~6 μs in duration.

In one example, the wavelength of channel $\lambda_1$ is 1538 nm and the wavelength of channel $\lambda_{32}$ is 1570 nm with a constant channel spacing of 1 nm. For 0.1° angular resolution, this means that the grating dispersion is ~0.1°/nm. For these conditions, the grating parameters can be $\alpha=40°$, m=20, d=21 μm, $\delta=48°$.

Although the directional component is disclosed as being located external to the LIDAR assembly, all or a portion of the directional component can be incorporated into the LIDAR assembly. For instance, all or a portion of the directional component can be located on the base 102 and/or on the common support 122.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A LIDAR system, comprising:
a LIDAR assembly configured to output a LIDAR output signal that carries multiple different channels; and
a directional component having an optical grating that receives the LIDAR output signal from the LIDAR assembly,
the optical grating configured to demultiplex the LIDAR output signal into multiple LIDAR output channels that each carries a different one of the channels,
the optical grating is configured to rotate around an axis such that an angle of incidence of the LIDAR input signal on the optical grating does not change in response to the rotation, and
the directional component being configured to steer a direction that each of the LIDAR output channels travel away from the LIDAR system.

2. The system of claim 1, wherein the LIDAR output channels each travels away from the directional component in a different direction.

3. The system of claim 1, wherein the directional component includes a mirror that receives the LIDAR output channels from the optical grating.

4. The system of claim 3, wherein the mirror is configured such that a distance between the optical grating and the mirror and an angular orientation between the optical grating and the mirror does not change in response to a rotation of the optical grating around the axis.

5. The system of claim 4, wherein the mirror is configured to be rotated on one or more transverse axes such that a direction that the LIDAR output channels travel away from the directional component changes in response to the rotation of the mirror.

6. The system of claim 1, wherein the directional component is configured to receive LIDAR input channels,
each LIDAR input channel including light from one of the LIDAR output channels after reflection of the LIDAR output channel by an object located outside of the LIDAR system,
the directional component being configured to multiplex the LIDAR input channels into a LIDAR return signal.

7. The system of claim 6, wherein the optical grating multiplexes the LIDAR input channels into the LIDAR return signal.

* * * * *